(12) United States Patent
Sasai et al.

(10) Patent No.: US 9,685,914 B2
(45) Date of Patent: Jun. 20, 2017

(54) AMPLIFIER CIRCUIT

(71) Applicant: ALPS ELECTRIC CO., LTD., Tokyo (JP)

(72) Inventors: Kiyoshi Sasai, Miyagi-ken (JP); Akira Asao, Miyagi-ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/065,066

(22) Filed: Mar. 9, 2016

(65) Prior Publication Data

US 2016/0190998 A1    Jun. 30, 2016

Related U.S. Application Data

(63) Continuation of application No. PCT/JP2014/073497, filed on Sep. 5, 2014.

(30) Foreign Application Priority Data

Sep. 13, 2013 (JP) .................................. 2013-190917

(51) Int. Cl.
*H03F 3/45* (2006.01)
*H03F 1/26* (2006.01)
*H03F 3/393* (2006.01)

(52) U.S. Cl.
CPC ............... *H03F 1/26* (2013.01); *H03F 3/393* (2013.01); *H03F 3/4565* (2013.01);
(Continued)

(58) Field of Classification Search
CPC ........................................................ H03F 3/45
(Continued)

(56) References Cited

U.S. PATENT DOCUMENTS

| 4,103,245 A | 7/1978 | Yokoyama |
| 4,823,093 A * | 4/1989 | Frey ..................... H03G 1/0023 330/254 |

(Continued)

FOREIGN PATENT DOCUMENTS

| JP | 07-046046 A | 2/1995 |
| JP | 2009290704 A | 12/2009 |

(Continued)

OTHER PUBLICATIONS

International Search Report for corresponding International Patent Application No. PCT/JP2014/073497, mailed on Oct. 14, 2014, 5 pages.

*Primary Examiner* — Henry Choe
(74) *Attorney, Agent, or Firm* — Brinks Gilson & Lione

(57) ABSTRACT

A differential signal is input to a pair of gates of a differential pair, a differential signal generated by a load circuit connected to drains of the differential pair is amplified by a differential amplifier stage, and the amplified differential signal is fed back to a pair of sources of the differential pair via a feedback circuit. It is possible to maintain a high input impedance in the pair of gates of the differential pair while not being influenced by a gain of negative feedback of an amplifier circuit, and it is possible to perform amplification in an input stage by using a pair of a first transistor and a second transistor of the differential pair. Therefore, compared with the related art, it is possible to decrease the number of transistors in the input stage and to reduce a flicker noise.

5 Claims, 3 Drawing Sheets

(52) U.S. Cl.
CPC ..... *H03F 3/45197* (2013.01); *H03F 3/45668* (2013.01); *H03F 2200/171* (2013.01); *H03F 2200/261* (2013.01); *H03F 2200/381* (2013.01); *H03F 2200/411* (2013.01); *H03F 2200/555* (2013.01); *H03F 2203/45116* (2013.01); *H03F 2203/45188* (2013.01); *H03F 2203/45358* (2013.01); *H03F 2203/45652* (2013.01); *H03F 2203/45674* (2013.01); *H03F 2203/45682* (2013.01)

(58) Field of Classification Search
USPC ..................................................... 330/260, 9
See application file for complete search history.

(56) References Cited

U.S. PATENT DOCUMENTS

| | | | | |
|---|---|---|---|---|
| 5,206,602 A | * | 4/1993 | Baumgartner | A61B 5/04004 330/258 |
| 5,493,253 A | * | 2/1996 | Ogou | H03F 3/45376 330/253 |
| 6,100,759 A | * | 8/2000 | Sirna | H03F 3/26 330/252 |
| 7,525,381 B2 | * | 4/2009 | Murden | H03F 3/45242 330/253 |

FOREIGN PATENT DOCUMENTS

| | | |
|---|---|---|
| JP | 2011019156 A | 1/2011 |
| JP | 2013038663 A | 2/2013 |
| JP | 2013626910 A | 2/2013 |

\* cited by examiner

AMPLIFIER CIRCUIT

CLAIM OF PRIORITY

This application is a Continuation of International Application No. PCT/JP2014/073497 filed on Sep. 5, 2014, which claims benefit of priority to Japanese Patent Application No. 2013-190917 filed on Sep. 13, 2013. The entire contents of each application noted above are hereby incorporated by reference in their entireties.

BACKGROUND

1. Field of the Disclosure

The present disclosure relates to an amplifier circuit that inputs thereto, in a high impedance, a weak signal from a sensor or the like and amplifies the weak signal.

2. Description of the Related Art

Generally an instrumentation amplifier is known that is used as a circuit that inputs thereto, in a high impedance, a weak signal generated by a sensor or the like and amplifies the weak signal. In Japanese Unexamined Patent Application Publication No. 7-46046, describes a technology for amplifying an output signal from a magnetic head by using an instrumentation amplifier.

FIGS. 4A and 4B are diagrams each illustrating a basic configuration of an instrumentation amplifier. As illustrated in FIG. 4A, the instrumentation amplifier is configured by using two operational amplifiers U1 and U2. In the operational amplifiers U1 and U2, feedback resistors R11 and R12 are connected between respective output terminals thereof and respective inverting input terminals thereof, and the respective inverting input terminals of the operational amplifiers U1 and U2 are connected to each other via a resistor R13. If a signal is input to non-inverting input terminals of the respective operational amplifiers U1 and U2, an amplified signal is output, as a differential signal, from outputs of the respective operational amplifiers U1 and U2.

Since the non-inverting input terminals of the respective operational amplifiers U1 and U2 function as signal input terminals, the instrumentation amplifier has a very high input impedance. By matching resistance values of the feedback resistors R11 and R12 with each other, a high common-mode signal rejection ratio (CMRR) is obtained.

In addition, a gain of the instrumentation amplifier is adjustable by a resistance value of the resistor R13, and the high input impedance or the common-mode signal rejection ratio is not influenced by the resistance value of the resistor R13. In a case of a general differential amplifier circuit in which an operational amplifier is subjected to negative feedback by using a resistance element, both a gain and an input impedance change in accordance with a resistance value of the resistance element. However, in a case of the instrumentation amplifier, a high input impedance is maintained independently of a setting of a gain based on negative feedback.

FIG. 4B is a diagram illustrating a configuration of a general operational amplifier used for the instrumentation amplifier. The operational amplifier illustrated in FIG. 4B includes an input amplifier stage (Q21 to Q24 and 101) and an output amplifier stage (Q25, R14, C11, and 102). The input amplifier stage includes a differential pair (Q21 and Q22) configured by two transistors, a current mirror circuit (Q23 and Q24) connected, as a load, to a drain side of the differential pair, and a constant current circuit 101 that applies a constant current to a source side of the differential pair. The output amplifier stage includes a transistor Q25 configuring a source-grounded amplifier circuit, a constant current circuit 102 connected, as a load, to a drain of the transistor Q25, and A phase compensation circuit (R14 and C11) that limits a band of the output amplifier stage for the stability of a feedback system.

In a case where a direct-current or low-frequency minute signal is amplified with a high gain, there is a problem that a flicker noise (a 1/f noise) that increases with a decrease in frequency is required to be reduced. The flicker noise is mainly generated by a transistor. Therefore, if many transistors are used for an input stage, the influence of the flicker noise grows. In a case of the operational amplifier illustrated in FIG. 4B, two transistors are used, as a differential pair, for the input stage. Therefore, if this is used for the instrumentation amplifier illustrated in FIG. 4A, four transistors turn out to be used for an input stage as a whole. Accordingly, compared with a case where a single operational amplifier is used, the number of transistors in the input stage increases in the instrumentation amplifier, and there is a problem that the flicker noise is considerable.

The present invention is made in view of such a situation and provides an amplifier circuit able to maintain a high input impedance while not being influenced by a setting of a gain based on negative feedback and able to reduce a noise caused by transistors in an input stage.

SUMMARY

An amplifier circuit includes a differential pair including a pair of a first transistor and a second transistor, wherein each of the first transistor and the second transistor is a transistor of a predetermined type in which, in response to a voltage between a control terminal and a first terminal, a current flowing between the first terminal and a second terminal is controlled, and a differential signal is input to a pair of the control terminals included in the pair of the first transistor and the second transistor. A load circuit is configured to generate a differential signal corresponding to currents flowing through a pair of the second terminals included in the pair of the first transistor and the second transistor in the differential pair. An output amplifier stage is configured to amplify and output the differential signal generated by the load circuit. A feedback circuit is configured to feed the differential signal output by the output amplifier stage back to a pair of the first terminals included in the pair of the first transistor and the second transistor in the differential pair.

According to the amplifier circuit, the differential signal is input to the pair of the control terminals of the differential pair, the differential signal is generated by the load circuit in accordance with the currents flowing through the pair of second terminals of the differential pair, the differential signal generated by the load circuit is amplified by the output amplifier stage, and the differential signal output by the output amplifier stage is fed back to the pair of the first terminals of the differential pair. From this, an input impedance in the pair of the control terminals of the differential pair is hardly influenced by the gain of the negative feedback of the above-mentioned amplifier circuit. In addition, since amplification in an input stage is performed by the pair of the first transistor and the second transistor of the differential pair, a low-frequency noise such as a flicker noise, caused by transistors in the input stage, is reduced.

DESCRIPTION OF THE EXEMPLARY EMBODIMENTS

Figure 1:
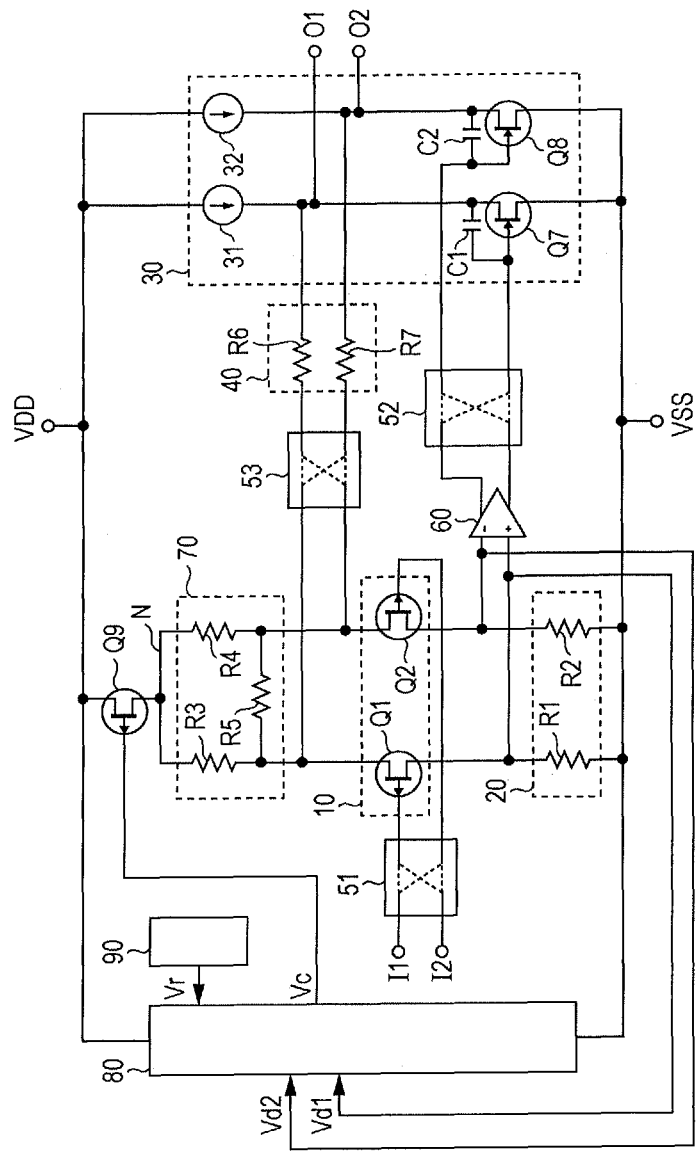
FIG. 1 is a diagram illustrating an example of a configuration of an amplifier circuit according to an embodiment of the present invention.

FIG. 1 is a diagram illustrating an example of a configuration of an amplifier circuit according to an embodiment of the present invention.

The amplifier circuit illustrated in FIG. 1 may include a differential pair 10, a load circuit 20, an output amplifier stage 30, a feedback circuit 40, a first chopping circuit 51, a second chopping circuit 52, a third chopping circuit 53, a differential amplifier stage 60, a resistance circuit 70, a p-type MOS transistor Q9, a common-mode feedback circuit 80, and a reference voltage generation circuit 90.

The differential pair 10 is an embodiment of a differential pair in the present invention.

The load circuit 20 is an embodiment of a load circuit in the present invention.

The output amplifier stage 30 is an embodiment of an output amplifier stage in the present invention.

The feedback circuit 40 is an embodiment of a feedback circuit in the present invention.

The first chopping circuit 51 is an embodiment of a first chopping circuit in the present invention.

The second chopping circuit 52 is an embodiment of a second chopping circuit in the present invention.

The third chopping circuit 53 is an embodiment of a third chopping circuit in the present invention.

The differential amplifier stage 60 is an embodiment of a differential amplifier stage in the present invention.

The resistance circuit 70 is an embodiment of a resistance circuit in the present invention.

The p-type MOS transistor Q9 is an embodiment of a variable resistance element in the present invention.

The common-mode feedback circuit 80 is an embodiment of a common-mode feedback circuit in the present invention.

The reference voltage generation circuit 90 is an embodiment of a reference voltage generation circuit in the present invention.

The differential pair 10 includes a pair of a first p-type MOS transistor Q1 and a second p-type MOS transistor Q2, which input a differential signal. The first p-type MOS transistor Q1 and the second p-type MOS transistor Q2 each include a gate (corresponding to a control terminal in the present invention), a source (corresponding to a first terminal in the present invention), and a drain (corresponding to a second terminal in the present invention) and each control a current (Id) that flows between the source and the drain, in accordance with a voltage (Vgs) input between the gate and the source. The differential pair 10 inputs the differential signal in a pair of gates of the first p-type MOS transistor Q1 and the second p-type MOS transistor Q2.

By repeatedly inverting the polarity of the differential signal input from an input terminal pair (11 and 12) to the pair of gates of the differential pair 10, the first chopping circuit 51 may shift frequency components of the differential signal to a frequency band on a high frequency side. In other words, by repeating polarity inversion of the differential signal, the first chopping circuit 51 may modulate the differential signal so that the differential signal becomes a high-frequency signal.

Figure 2:
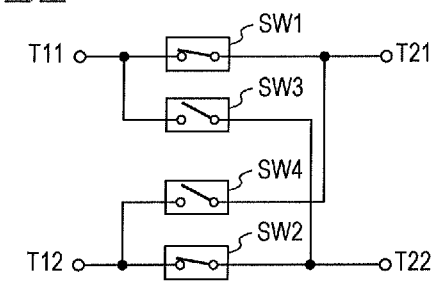
FIG. 2 is a diagram illustrating an example of a configuration of a chopping circuit.

FIG. 2 is a diagram illustrating an example of a configuration of the first chopping circuit 51.

As illustrated in, for example, FIG. 2, the first chopping circuit 51 includes two respective terminal pairs (T11 and T12, and T21 and T22), to and from which the differential signal is input and output, and switch circuits SW1 to SW4 that switch connections between the terminal pairs.

The switch circuit SW1 turns on or off a connection path between the terminal T11 and the terminal T21. The switch circuit SW2 turns on or off a connection path between the terminal T12 and the terminal T22. The switch circuit SW3 turns on or off a connection path between the terminal T11 and the terminal T22. The switch circuit SW4 turns on or off a connection path between the terminal T12 and the terminal T21.

In a case where both the switch circuits SW1 and SW2 are turned on, both the switch circuits SW3 and SW4 are turned off. In a case where both the switch circuits SW1 and SW2 are turned off, both the switch circuits SW3 and SW4 are turned on. The individual switch circuits repeat such switching, thereby repeatedly inverting the polarity of the differential signal input and output to and from the two respective terminal pairs (T11 and T12, and T21 and T22). The polarity inversion of the differential signal in the first chopping circuit 51 may be performed with, for example, a constant frequency or may be performed while a frequency is randomly changed within a predetermined range.

The load circuit 20 is a circuit that generates a differential signal corresponding to currents flowing through the pair of drains of the differential pair 10, and as illustrated in, for example, FIG. 1, the load circuit 20 includes resistors R1 and R2 through which the currents from the pair of drains flow. The resistor R1 is provided in a current path between the drain of the first p-type MOS transistor Q1 and a second power-supply line VSS (a ground level), and the resistor R2 is provided in a current path between the drain of the second p-type MOS transistor Q2 and the second power-supply line VSS. It is desirable that each of the resistors R1 and R2 is a passive element not including an active element such as a transistor to serve as a noise generation source.

The differential amplifier stage 60 may be a circuit that amplifies the differential signal generated by the load circuit 20. In the same way as in the input amplifier stage (Q21 to 24 and 101) of the operational amplifier illustrated in, for example, FIG. 4A, the differential amplifier stage 60 includes a differential pair, a constant current circuit, and a load circuit (loads of active elements such as a current mirror circuit or loads based on resistance elements).

By repeatedly inverting, in synchronization with the polarity inversion based on the first chopping circuit 51, the polarity of a differential signal output by the differential amplifier stage 60, the second chopping circuit 52 may bring the frequency components of the differential signal back to an original frequency band from the frequency band on the high frequency side to which the frequency components of the differential signal are shifted by the first chopping circuit 51. In other words, by subjecting, to polarity inversion again, the differential signal modulated by the first chopping circuit 51 into a high-frequency signal so as to cancel out the polarity inversion based on the first chopping circuit 51, the second chopping circuit 52 may demodulate and bring the differential signal back to a signal in the original frequency band.

The second chopping circuit 52 has the configuration illustrated in, for example, FIG. 2 and performs the same switching of connection paths as that of the above-mentioned first chopping circuit 51.

The output amplifier stage 30 amplifies the differential signal brought back to the original frequency band by the second chopping circuit 52 and outputs the differential signal from the output terminal pair (O1 and O2). The output amplifier stage 30 may include a phase compensation circuit for securing the stability of a feedback loop and may have a low-pass filter characteristic in which high-frequency components higher than or equal to a predetermined frequency are attenuated by the effect of this phase compensation. Using the low-pass filter characteristic based on the phase compensation, the output amplifier stage 30 attenuates generated high-frequency components accompanied by polarity inversion operations of the first to third chopping circuits 51 to 53.

In the example of FIG. 1, the output amplifier stage 30 includes n-type MOS transistors Q7 and Q8, constant current circuits 31 and 32, and capacitors C1 and C2. The n-type MOS transistors Q7 and Q8 each configure a source-grounded amplifier circuit. Sources of the n-type MOS transistors Q7 and Q8 are connected to the second power-supply line VSS, drains thereof are connected to a first power-supply line VDD via the constant current circuits 31 and 32 serving as loads, and the differential signal from the second chopping circuit 52 is input to gates thereof. The output amplifier stage 30 outputs a differential signal from the drains of the n-type MOS transistors Q7 and Q8 to the output terminal pair (O1 and O2). The capacitors C1 and C2 are phase compensation circuits each used for suppressing a gain at a high frequency and are connected between the drains and gates of the respective n-type MOS transistors Q7 and Q8.

The feedback circuit 40 may feed the differential signal output by the output amplifier stage 30 back to the pair of sources of the differential pair 10. In the example of FIG. 1, the feedback circuit 40 may include resistors R6 and R7 that connect respective outputs of the output amplifier stage 30 (the drains of the n-type MOS transistors Q7 and Q8) and the pair of sources of the differential pair 10 to each other.

By repeatedly inverting, in synchronization with the polarity inversion based on the first chopping circuit 51, the polarity of the differential signal fed back to the pair of sources of the differential pair 10 by the feedback circuit 40, the third chopping circuit 53 may shift frequency components of the differential signal to the frequency band on the high frequency side again. In other words, before the differential signal demodulated from the modulated differential signal of the differential pair 10 by the second chopping circuit 52 is fed back to the differential pair 10 by the feedback circuit 40, the third chopping circuit 53 may modulate the demodulated differential signal again so that the demodulated differential signal becomes a signal synchronized with the modulated differential signal of the differential pair 10.

The third chopping circuit 53 has the configuration illustrated in, for example, FIG. 2 and performs the same switching of connection paths as those of the above-mentioned first chopping circuit 51 and second chopping circuit 52.

The resistance circuit 70 may be provided in paths of currents shunted from a common node N to the pair of sources of the differential pair 10 and may set bias voltages of the differential pair 10, a gain of an amplifier circuit based on negative feedback of the feedback circuit 40, and so forth.

In the example of FIG. 1, the resistance circuit 70 includes resistors R3, R4, and R5. The resistor R3 is provided in a path of a current that flows from the common node N to the source of the first p-type MOS transistor Q1. The resistor R4 is provided in a path of a current that flows from the common node N to the source of the second p-type MOS transistor Q2. The resistor) R5 is connected between the sources of the first p-type MOS transistor Q1 and the second p-type MOS transistor Q2.

The p-type MOS transistor Q9 may be provided in a path of a current that flows from the first power-supply line VDD to the common node N, and the p-type MOS transistor Q9 may function as a variable resistance element whose resistance value changes in accordance with a bias voltage Vc output by the common-mode feedback circuit 80. The source of the p-type MOS transistor Q9 may be connected to the first power-supply line VDD, the drain thereof may be connected to the common node No, and the bias voltage Vc may be input to the gate thereof.

The common-mode feedback circuit 80 may control the resistance value of the p-type MOS transistor Q9 so that a common-mode voltage in the pair of drains of the differential pair 10 comes close to a predetermined voltage corresponding to a reference voltage Vr generated by the reference voltage generation circuit 90.

Figure 3:
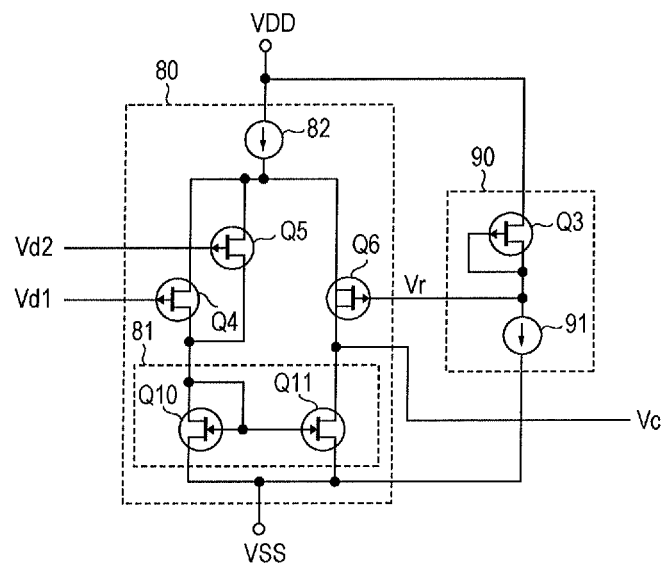
FIG. 3 is a diagram illustrating examples of configurations of a common-mode feedback circuit and a reference voltage generation circuit.

FIG. 3 is a diagram illustrating examples of configurations of the common-mode feedback circuit 80 and the reference voltage generation circuit 90.

In the examples of FIG. 3, the common-mode feedback circuit 80 may include a fourth p-type MOS transistor Q4, a fifth p-type MOS transistor Q5, a sixth p-type MOS transistor Q6, a current mirror circuit 81, and a second constant current circuit 82. In addition, the reference voltage generation circuit 90 may include a third p-type MOS transistor Q3 and a first constant current circuit 91.

The third p-type MOS transistor Q3 may input and output, into the source thereof and from the drain thereof, a current that flows from the first power-supply line VDD. In the example of FIG. 3, the source of the third p-type MOS transistor Q3 may be connected to the first power-supply line VDD, the gate thereof may be connected to the drain thereof, and a connection point between the gate and the drain may be connected to the second power-supply line VSS of a ground level via the first constant current circuit 91. The first constant current circuit 91 may apply a constant current from the drain of the third p-type MOS transistor Q3 to the second power-supply line VSS. The reference voltage generation circuit 90 may supply, as the reference voltage Vr, a voltage generated at the connection point between the gate and the drain of the third p-type MOS transistor Q3 to the common-mode feedback circuit 80.

The fourth p-type MOS transistor Q4 and the fifth p-type MOS transistor Q5 may be connected in parallel in the respective drains and the respective sources thereof (the respective drains and the respective sources of the two may be connected to each other). The source of the sixth p-type MOS transistor Q6 may be connected to the sources of the fourth p-type MOS transistor Q4 and the fifth p-type MOS transistor Q5 in common.

The current mirror circuit 81 may apply, from the drain of the sixth p-type MOS transistor Q6 to the second power-supply line VSS, a current corresponding to currents that flow from the respective drains of the fourth p-type MOS transistor Q4 and the fifth p-type MOS transistor Q5 to the second power-supply line VSS.

In the example of FIG. 3, the current mirror circuit 81 may include n-type MOS transistors Q10 and Q11. Each of the drain and the gate of the n-type MOS transistor Q10 may be connected to the drain of the fourth p-type MOS transistor Q4 and the drain of the fifth p-type MOS transistor Q5, and the source of the n-type MOS transistor Q10 may be connected to the second power-supply line VSS. The drain of the n-type MOS transistor Q11 may be connected to the drain of the sixth p-type MOS transistor Q6, the gate thereof may be connected to the gate of the n-type MOS transistor Q10, and the source thereof may be connected to the second power-supply line VSS.

The second constant current circuit 82 may apply a constant current from the first power-supply line VDD to the sources of the fourth p-type MOS transistor 48, the fifth p-type MOS transistor Q5, and the sixth p-type MOS transistor Q6, which are connected in common.

The differential voltage (Vd1 and Vd2) generated in the load circuit 20 by the drain currents of the differential pair 10 may be input to the gate of the fourth p-type MOS transistor Q4 and the gate of the fifth p-type MOS transistor Q5. Specifically, the drain of the first p-type MOS transistor Q1 in the differential pair 10 may be connected to the gate of the fourth p-type MOS transistor Q4, and the drain of the second p-type MOS transistor Q2 in the differential pair 10 may be connected to the gate of the fifth p-type MOS transistor Q5.

In addition, the reference voltage Vr generated by the reference voltage generation circuit 90 may be input to the gate of the sixth p-type MOS transistor Q6. Specifically, the gate and the drain of the third p-type MOS transistor Q3 may be connected to the gate of the sixth p-type MOS transistor Q6.

Furthermore, a voltage generated in the drain of the sixth p-type MOS transistor Q6 may be input, as the bias voltage Vc, to the gate of the p-type MOS transistor Q9.

Here, an operation of an amplifier circuit according to the present embodiment and having the above-mentioned configuration will be described. In order to facilitate understanding, first an operation in a direct-current state in which the polarity inversion operations in the first to third chopping circuits 51 to 53 are stopped will be described.

In the amplifier circuit illustrated in FIG. 1, a first-stage differential amplifier stage may be configured by the differential pair 10, the load circuit 20, the resistance circuit 70, and the p-type MOS transistor Q5. The differential signal amplified by the first-stage differential amplifier stage may be further amplified by the differential amplifier stage 60 and the output amplifier stage 30. The differential signal output by the output amplifier stage 30 may be negatively fed back to the first-stage differential amplifier stage (the sources of the differential pair 10) via the feedback circuit 40.

In the first-stage differential amplifier stage, the values of individual elements in the load circuit 20, the resistance circuit 70, the feedback circuit 40, and so forth may be set so that the currents that flow through the first p-type MOS transistor Q1 and the second p-type MOS transistor Q2 in the differential pair 10 become roughly equal to each other in a case where the differential voltage input to the input terminal pair (11 and 12) is zero.

If a voltage of the input terminal 11 becomes lower than a voltage of the input terminal 12, a drain current that flows through the first p-type MOS transistor Q1 becomes larger than a drain current of the second p-type MOS transistor Q2. In this case, a voltage of the resistor R1 becomes higher than a voltage of the resistor R2, and a gate voltage of the n-type MOS transistor Q7 becomes higher than a gate voltage of the n-type MOS transistor Q8. Therefore, a voltage of the output terminal O1 becomes lower than that of the output terminal O2. If the voltage of the output terminal O1 becomes lower than that of the output terminal O2, a current that flows through the resistor R6 of the feedback circuit 40 becomes larger than a current that flows through the resistor R7. Therefore, negative feedback acts in a direction in which the current that flows into the source of the first p-type MOS transistor Q1 is caused to become smaller than the current that flows into the source of the second p-type MOS transistor Q2.

On the other hand, if the voltage of the input terminal 11 becomes higher than the voltage of the input terminal 12, an operation opposite to the above-mentioned operation causes the voltage of the output terminal O1 to become lower than that of the output terminal O2 and causes negative feedback to act in a direction of suppressing the gain thereof.

In a case where it is assumed that a gain of three stages based on the first-stage differential amplifier stage (10, 20, 70, and Q9), the subsequent-stage differential amplifier stage 60, and the output amplifier stage 30 is sufficiently large, a gain of the amplifier circuit in a state of applying the negative feedback is set mainly by the impedance of the feedback circuit 40 and the impedance of the first-stage differential amplifier stage viewed from a connection point with the feedback circuit 40. On the other hand, in the amplifier circuit illustrated in FIG. 1, the input terminal pair (11 and 12) is directly connected to the gates of the first p-type MOS transistor Q1 and the second p-type MOS transistor Q2. Accordingly, the input impedance of the amplifier circuit is hardly influenced by circuits connected to the drain sides and source sides of the first p-type MOS transistor Q1 and the second p-type MOS transistor Q2. In other words, in the amplifier circuit illustrated in FIG. 1, a high input impedance is maintained while not being influenced by a setting of a gain based on the negative feedback.

In this way, in the amplifier circuit illustrated in FIG. 1, on the one hand, there is an advantage that it is possible to maintain the high input impedance while not being influenced by a setting of a gain. However, at the same time, there is a problem that feedback of the output signal to the source side of the differential pair 10 causes the output signal to be susceptible to a voltage variation in a power-supply line and causes a power-supply voltage variation rejection ratio (PSRR) to be decreased.

In other words, in the amplifier circuit illustrated in FIG. 1, if the transconductances gm of the first and second transistors (Q1 and Q2) configuring the differential pair 10 change, the impedance of the first-stage differential amplifier stage viewed from the connection point with the feedback circuit 40 changes in response to these, and as a result, the gain of the amplifier circuit in a state of applying the negative feedback changes. The transconductance gm of a MOS transistor changes in response to a bias current that flows through the drain thereof. Therefore, if the bias current changes in response to the variation in the power-supply voltage, the gain of the amplifier circuit in a state of applying the negative feedback changes, and a variation is generated in the output signal in response to the change in the gain.

Figure 4A:
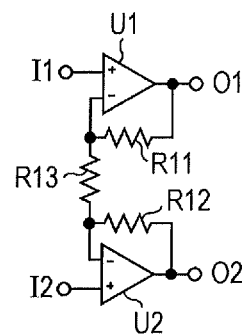
FIGS. 4A and 4B are diagrams each illustrating a basic configuration of an instrumentation amplifier.
Figure 4B:
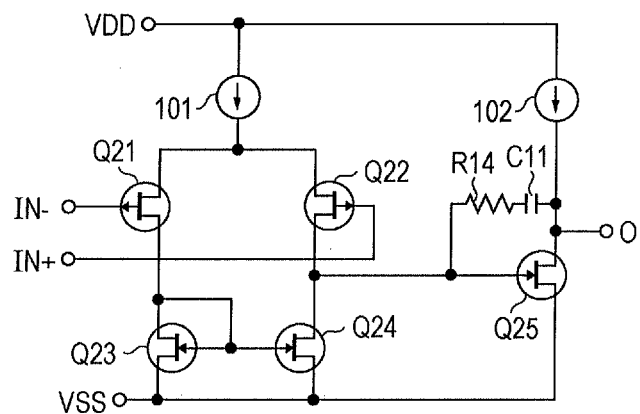

In a case of a method in which, like the instrumentation amplifier illustrated in FIGS. 4A and 4B, an output signal is fed back to the gate in a high impedance of a MOS transistor, even if the transconductance gm of the MOS transistor slightly varies, the gain of an amplifier circuit in a state of applying negative feedback does not considerably change in response to this. In contrast, in the amplifier circuit illustrated in FIG. 1, the transconductance gm of each of the MOS transistors serves as one element that determines the gain of the amplifier circuit in a state of applying the negative feedback. Therefore, a variation in the transconductance gm directly causes a variation in the gain.

Therefore, in the amplifier circuit illustrated in FIG. 1, in order to suppress a variation in the output signal, due to such a variation in a power-supply voltage, the resistance value of the p-type MOS transistor Q9 is controlled so that the common-mode voltage of the differential voltage (Vd1 and Vd2) generated by the load circuit 20 is maintained at a constant voltage.

In the common-mode feedback circuit 80 illustrated in FIG. 3, if the common-mode voltage of the differential voltage (Vd1 and Vd2) increases, the sum of the currents that flow through the fourth p-type MOS transistor Q4 and the fifth p-type MOS transistor Q5 decreases, a current that flows through the n-type MOS transistor Q10 in the current mirror circuit 81 decreases, and in response to this, the impedance of the n-type MOS transistor Q11 increases. On the other hand, if the sum of the currents that flow through the fourth p-type MOS transistor Q4 and the fifth p-type MOS transistor Q5 decreases, the source electric potential of the sixth p-type MOS transistor Q6 is adjusted by the constant current circuit 82 so that a current corresponding to the decrease flows through the sixth p-type MOS transistor Q6. Accordingly, the impedance of the sixth p-type MOS transistor Q6 decreases. The impedance of the n-type MOS transistor Q11 increases, and the impedance of the sixth p-type MOS transistor Q6 decreases. Therefore, the bias voltage Vc output from the drain of the sixth p-type MOS transistor Q6 changes in an increasing direction. If the bias voltage Vc changes in the increasing direction, the resistance value of the p-type MOS transistor Q9 increases. Therefore, the bias currents of the differential pair 10, which flow from the first power-supply line VDD via the p-type MOS transistor Q9, decrease, and feedback is applied in a direction in which an increase in the common-mode voltage of the differential voltage (Vd1 and Vd2) is suppressed.

On the other hand, if the common-mode voltage of the differential voltage (Vd1 and Vd2) decreases, an operation opposite to the above-mentioned operation causes the bias voltage Vc output from the drain of the sixth p-type MOS transistor Q6 to change in a decreasing direction, and feedback is applied in a direction in which an increase in the common-mode voltage of the differential voltage (Vd1 and Vd2) is suppressed.

Based on such a negative feedback operation, the common-mode voltage of the differential voltage (Vd1 and Vd2) is suppressed so as to come close to the predetermined voltage corresponding to the reference voltage Vr.

If the common-mode voltage of the differential voltage (Vd1 and Vd2) is controlled so as to become constant, the bias currents of the differential pair 10, which flow through the load circuit 20, become constant, variations in the bias currents, which correspond to a variation in a power-supply voltage, are suppressed, and a variation in the gain of the amplifier circuit, which corresponds to the variations in the bias currents, is suppressed. Therefore, as a result, a variation in the output signal, which correspond to the variation in the power-supply voltage, is suppressed.

Note that, in the reference voltage generation circuit 90 illustrated in FIG. 3, the reference voltage Vr is generated based on a voltage between the gate and the source of the third p-type MOS transistor Q3 whose gate and drain are connected. Therefore, if the influence of a change in temperature causes a threshold value voltage Vth of the third p-type MOS transistor Q3 to change, the reference voltage Vr changes in response to this, and the common-mode voltage of the voltages (Vd1 and Vd2). On the other hand, as for each of the first p-type MOS transistor Q1 and the second p-type MOS transistor Q2 of the differential pair 10, which has the same conductivity type as that of the third p-type MOS transistor Q3, the influence of a change in temperature causes a threshold value voltage Vth thereof to change, in the same way as in the third p-type MOS transistor Q3. Therefore, a change in the common-mode voltage of the voltages (Vd1 and Vd2), accompanied by a change in the threshold value voltage Vth of the third p-type MOS transistor Q3, and a change in each of the threshold value voltages Vth of the first p-type MOS transistor Q1 and the second p-type MOS transistor Q2 cancel out each other, and a variation in the gain of the amplifier circuit, due to the influence of temperature, is suppressed.

The above is the operation in the direct-current state of the amplifier circuit illustrated in FIG. 1 to FIG. 3.

Next, a case of performing the polarity inversion operations in the first to third chopping circuits 51 to 53 will be described.

In this case, in basically the same way as in the direct-current state, the differential signal is amplified. However, a point different from the case of the direct-current state is that the frequency components of the differential signal amplified by the first-stage differential amplifier stage (10, 20, 70, and Q9) and the subsequent-stage differential amplifier stage 60 are shifted to a frequency band higher than those in the direct-current state. While increasing with a decrease in frequency, the flicker noise (the 1/f noise) serving as an obstacle to amplifying a direct-current or low-frequency minute signal hardly remains in the high frequency band. Accordingly, in the first-stage differential amplifier stage (10, 20, 70, and Q9) and the subsequent-stage differential amplifier stage 60, the differential signal is amplified in the high-frequency band in which there is a considerably small flicker noise. Therefore, flicker noise components contained by the amplified output signal are considerably reduced. In addition, in the output amplifier stage 30, by using the low-pass filter characteristic based on the phase compensation, generated high-frequency components accompanied by the polarity inversion operations of the first to third chopping circuits 51 to 53 are attenuated. As a result, the differential signal output by the output amplifier stage 30 becomes a considerably-low-noise signal from which the flicker noise and noises of the first to third chopping circuits 51 to 53 are removed.

As described above, according to the amplifier circuit according to the present embodiment, the differential signal is input to the pair of gates of the differential pair 10, the differential signal generated by the load circuit 20 connected to the drains of the differential pair 10 is amplified by the output amplifier stage 30, and the amplified differential signal is fed back to the pair of sources of the differential pair 10 via the feedback circuit 40. From this, it is possible to maintain the high input impedance in the pair of gates of the differential pair 10 while not being influenced by the gain of the negative feedback of the amplifier circuit, and it is possible to perform amplification in the input stage by using the pair of the first p-type MOS transistor Q1 and the second p-type MOS transistor Q2 of the differential pair 10. Therefore, compared with the related art, it is possible to decrease the number of transistors in the input stage and to reduce a noise such as a flicker.

Accordingly, it becomes possible to amplify, with a considerably low noise, a direct-current or low-frequency minute signal input by, for example, a Wheatstone bridge type resistance sensor or the like, and it becomes possible to realize a highly accurate sensor.

By decreasing the number of transistors in the input stage, it is possible to reduce a consumption current, and it is possible to reduce a circuit size.

In addition, according to the amplifier circuit according to the present embodiment, a configuration is adopted so that currents individually flow to the pair of sources of the differential pair 10 from the first power-supply line VDD via the p-type MOS transistor Q9 and the resistance circuit 70, and the resistance of the p-type MOS transistor Q5 is controlled so that the common-mode voltage in the pair of drains of the differential pair 10 comes close to the predetermined voltage corresponding to the reference voltage Vr. From this, the bias current that flows through each of the transistors (Q1 and Q2) of the differential pair 10 hardly changes owing to the influence of a power-supply voltage. Therefore, it is possible to suppress a variation in the bias current, caused by the influence of a power-supply voltage, to stabilize the gain of the amplifier circuit, and to reduce a variation in the output signal, caused by a variation in the power-supply voltage.

Furthermore, according to the amplifier circuit according to the present embodiment, the polarity of the differential signal input to the differential pair 10 is repeatedly inverted by the first chopping circuit 51, thereby shifting the frequency components of the differential signal to a frequency band on a high frequency side. In addition, the polarity of the differential signal input to the output amplifier stage 30 is repeatedly inverted by the second chopping circuit 52 in synchronization with the polarity inversion operation of the first chopping circuit 51, thereby bringing the frequency components of the differential signal back from the frequency band on the high frequency side to an original frequency band. In addition, the polarity of the differential signal fed back from the differential amplifier stage 60 to the differential pair 10 by the feedback circuit 40 is repeatedly inverted by the third chopping circuit 53 in synchronization with the polarity inversion operation of the first chopping circuit 51, thereby shifting the frequency components of the differential signal to the frequency band on the high frequency side.

Accordingly, in the first-stage differential amplifier stage including the differential pair 10, the differential signal is amplified in a state of being shifted to the high-frequency band in which the influence of the flicker noise is small. Therefore, it is possible to significantly reduce the components of the flicker noise included in the differential signal of an amplification result.

In addition, according to the amplifier circuit according to the present embodiment, frequency components, based on the polarity inversion operation and included in the differential signal brought back to the original frequency band by the second chopping circuit 52, are attenuated by the low-pass filter characteristic of the differential amplifier stage 60. Therefore, it is possible to obtain the considerably-low-noise output signal in which the flicker noise and noises due to the polarity inversion operations are reduced.

Furthermore, the low-pass filter characteristic of the differential amplifier stage 60 doubles as band limitation based on the phase compensation for securing the stability of the negative feedback system. Therefore, it is not necessary to separately provide a filter circuit for removing noises due to the polarity inversion operations, and it is possible to suppress an increase in a circuit size.

Since the phase compensation (C11 and R14) is performed in the inside of each of the operational amplifiers U1 and U2, the instrumentation amplifier of the related art, illustrated in FIGS. 4A and 4B, has a problem that it is difficult to achieve the reduction of a low-frequency noise by using a chopping circuit. However, in the amplifier circuit according to the present embodiment, since high-frequency components are prevented from passing through the output amplifier stage 30 that performs the phase compensation and that operates at a low speed. Therefore, it is possible to achieve the reduction of a low-frequency noise, based on the chopping (the polarity inversion operation), while performing the phase compensation.

While, as above, some embodiments of the present invention are described, the present invention is not limited to the above-mentioned embodiments and includes a variety of variations. In other words, the circuit configurations described in the above-mentioned embodiments are examples and may be replaced with other circuits for realizing the same functions.

While, in the above-mentioned embodiments, for example, p-type MOS transistors are used for differential pairs, the present invention is not limited to this. In another embodiment of the present invention, a differential pair may be configured by using n-type MOS transistors. In addition, by using semiconductor elements other than the MOS transistors (for example, bipolar transistors), a differential pair or another circuit may be configured.

While, in the above-mentioned embodiments, the voltage of the first power-supply line is higher than the voltage of the second power-supply line, the first power-supply line is set as a ground level and the second power-supply line is set as a power-supply voltage, depending on the type of transistor.

While, in the above-mentioned embodiments, the third chopping circuit 53 is provided between, for example, the feedback circuit 40 and the differential pair 10, a feedback circuit may be provided between the chopping circuit 53 and the differential pair 10 in another embodiment of the present invention.

What is claimed is:
1. An amplifier circuit comprising:
a differential pair including a pair of a first transistor and a second transistor, wherein each of the first transistor and the second transistor is a transistor in which, in response to a voltage between a control terminal and a first terminal, a current flowing between the first terminal and a second terminal is controlled, and a differential signal is input to a pair of the control terminals included in the pair of the first transistor and the second transistor;
a load circuit configured to generate a differential signal corresponding to currents flowing through a pair of the second terminals included in the pair of the first transistor and the second transistor in the differential pair;
an output amplifier stage configured to amplify and output the differential signal generated by the load circuit;
a feedback circuit configured to feed the differential signal output by the output amplifier stage back to a pair of the first terminals included in the pair of the first transistor and the second transistor in the differential pair;
a first chopping circuit configured to shift, to a frequency band on a high frequency side, frequency components of the differential signal input to the pair of the control terminals in the differential pair by repeatedly inverting polarity of the differential signal;
a second chopping circuit configured to bring, back to an original frequency band from the frequency band on the high frequency side, frequency components of the differential signal input to the output amplifier stage by repeatedly inverting, in synchronization with the polar- ity inversion operation of the first chopping circuit, polarity of the differential signal; and a third chopping circuit configured to shift, to the frequency band on the high frequency side, frequency components of the differential signal fed back to the pair of the first terminals of the differential pair by the feedback circuit by repeatedly inverting, in synchronization with the polarity inversion operation of the first chopping circuit, polarity of the differential signal; and wherein the output amplifier stage has a low-pass filter characteristic for attenuating frequency components due to the polarity inversion operation in the first chopping circuit.

2. The amplifier circuit according to claim 1, further comprising: An amplifier circuit comprising:

a first chopping circuit configured to shift, to a frequency band on a high frequency side, frequency components of the differential signal input to the pair of the control terminals in the differential pair by repeatedly inverting polarity of the differential signal; a second chopping circuit configured to bring, back to an original frequency band from the frequency band on the high frequency side, frequency components of the differential signal input to the output amplifier stage by repeatedly inverting, in synchronization with the polarity inversion operation of the first chopping circuit, polarity of the differential signal; a third chopping circuit configured to shift, to the frequency band on the high frequency side, frequency components of the differential signal fed back to the pair of the first terminals of the differential pair by the feedback circuit by repeatedly inverting, in synchronization with the polarity inversion operation of the first chopping circuit, polarity of the differential signal; wherein the output amplifier stage has a low-pass filter characteristic for attenuating frequency components due to the polarity inversion operation in the first chopping circuit; a differential pair including a pair of a first transistor and a second transistor, wherein each of the first transistor and the second transistor is a transistor in which, in response to a voltage between a control terminal and a first terminal, a current flowing between the first terminal and a second terminal is controlled, and a differential signal is input to a pair of the control terminals included in the pair of the first transistor and the second transistor; a load circuit configured to generate a differential signal corresponding to currents flowing through a pair of the second terminals included in the pair of the first transistor and the second transistor in the differential pair; an output amplifier stage configured to amplify and output the differential signal generated by the load circuit; a feedback circuit configured to feed the differential signal output by the output amplifier stage back to a pair of the first terminals included in the pair of the first transistor and the second transistor in the differential pair; and a differential amplifier stage configured to amplify the differential signal input to the second chopping circuit by the load circuit.

3. An amplifier circuit comprising:

a differential pair including a pair of a first transistor and a second transistor, wherein each of the first transistor and the second transistor is a transistor in which, in response to a voltage between a control terminal and a first terminal, a current flowing between the first terminal and a second terminal is controlled, and a differential signal is input to a pair of the control terminals included in the pair of the first transistor and the second transistor;

a load circuit configured to generate a differential signal corresponding to currents flowing through a pair of the second terminals included in the pair of the first transistor and the second transistor in the differential pair;

an output amplifier stage configured to amplify and output the differential signal generated by the load circuit;

a feedback circuit configured to feed the differential signal output by the output amplifier stage back to a pair of the first terminals included in the pair of the first transistor and the second transistor in the differential pair;

a resistance circuit provided in paths of currents shunted from a common node to the pair of the first terminals in the differential pair;

a variable resistance element provided in a path of a current flowing from a first power-supply line to the common node;

a common-mode feedback circuit configured to control resistance of the variable resistance element so that a common-mode voltage in the pair of the second terminals of the differential pair comes close to a predetermined voltage corresponding to an input reference voltage; and a reference voltage generation circuit including a third transistor having the same conductivity type as that of each of the first transistor and the second transistor configuring the differential pair, the third transistor inputting and outputting, to the first terminal thereof and from the second terminal thereof, a current flowing from the first power-supply line, the control terminal of the third transistor being connected to the second terminal, and a first constant current circuit configured to apply a constant current from the second terminal of the third transistor to a second power-supply line, wherein the reference voltage generation circuit generates the reference voltage corresponding to a voltage generated between the first terminal and the second terminal of the third transistor.

4. The amplifier circuit according to claim 3, wherein the common-mode feedback circuit includes:

a pair of a fourth transistor and a fifth transistor connected in parallel in the pair of the first terminals and the pair of the second terminals, a sixth transistor including the first terminal connected in common to the pair of the first terminals included in the pair of the fourth transistor and the fifth transistor, a current mirror circuit configured to apply, from the second terminal of the sixth transistor to the second power-supply line, a current corresponding to a current flowing from the pair of the second terminals included in the pair of the fourth transistor and the fifth transistor to the second power-supply line, and a second constant current circuit configured to apply a constant current from the first power-supply line to the first terminals of the fourth transistor, the fifth transistor, and the sixth transistor, connected in common, inputs the differential signal generated by the load circuit to the pair of the control terminals included in the pair of the fourth transistor and the fifth transistor, inputs the reference voltage to the control terminal of the sixth transistor, and controls resistance of the variable resistance element in accordance with a voltage generated in the second terminal of the sixth transistor.

5. The amplifier circuit according to claim 1, further comprising:
   a differential amplifier stage configured to amplify the differential signal input to the second chopping circuit by the load circuit.

\* \* \* \* \*